(12) United States Patent
Chang et al.

(10) Patent No.: US 7,265,614 B2
(45) Date of Patent: Sep. 4, 2007

(54) AMPLIFIER CIRCUIT WITH REDUCED POWER-OFF TRANSIENTS AND METHOD THEREOF

(75) Inventors: Chun-Hung Chang, Hsinchu (TW); Fu-Yuan Chen, Alian Township, Kaohsiung County (TW); Shu-Hua Wang, Hsinchu (TW)

(73) Assignee: Analog and Power Electronics Corp., Hsinchu (TW)

( * ) Notice: Subject to any disclaimer, the term of this patent is extended or adjusted under 35 U.S.C. 154(b) by 100 days.

(21) Appl. No.: 11/156,645

(22) Filed: Jun. 21, 2005

(65) Prior Publication Data

US 2005/0285671 A1 Dec. 29, 2005

(30) Foreign Application Priority Data

Jun. 23, 2004 (TW) .............................. 93118102 A

(51) Int. Cl.
*H03F 1/14* (2006.01)

(52) U.S. Cl. ........................................ 330/51; 330/297
(58) Field of Classification Search ................. 330/51, 330/99, 85, 96, 7 P, 98; 381/94.5
See application file for complete search history.

(56) References Cited

U.S. PATENT DOCUMENTS

| 5,151,942 A * | 9/1992 | Sasaki ........................ 381/94.5 |
| 6,208,203 B1 * | 3/2001 | Jung et al. ..................... 330/51 |
| 6,215,339 B1 * | 4/2001 | Hedberg ....................... 327/108 |

* cited by examiner

*Primary Examiner*—Henry Choe
(74) *Attorney, Agent, or Firm*—Rosenberg, Klein & Lee

(57) ABSTRACT

In an amplifier circuit with reduced power-off transients, an amplifier is provided for receiving an input signal and a reference signal to generate an output signal therefrom when it is enabled, and the amplifier is disabled when the supply voltage to the amplifier drops down to a threshold or to a level higher than the reference signal a threshold. The output stage transistor of the amplifier is applied with a body voltage to suppress the body diode parasitic to the output stage transistor to be forward-biased.

38 Claims, 6 Drawing Sheets

AMPLIFIER CIRCUIT WITH REDUCED POWER-OFF TRANSIENTS AND METHOD THEREOF

FIELD OF THE INVENTION

The present invention is related generally to an amplifier circuit for an audio system and more particularly, to an amplifier circuit with reduced power-off transients and a method thereof.

BACKGROUND OF THE INVENTION

Audio systems utilizing amplifier circuits for amplifying audio source signals in order to drive audio devices have been widely used in various electronic products. In a typical application circuit, as shown in FIG. 1, an audio amplifier chip 100 is used to drive an earphone 104 or a loudspeaker 106 based on an audio source signal 102. The audio source signal 102 is fed into the chip 100 through an input coupling capacitor 108 and an input resistor 110, and the chip 100 includes two operational amplifiers 112 and 114, with the inverting and non-inverting inputs 116 and 118 of the operational amplifier 112 connected to the input resistor 110 and a reference signal Vref, respectively, so as to generate an output signal Vo+ at the output 120 of the operational amplifier 112 to drive the earphone 104. To provide the reference signal Vref, a voltage divider composed of two resistors 132 and 134 are connected in series to a supply voltage $V_{DD}$ by a power input 136, in such a way that at a node 138 the reference signal Vref is generated, for example equal to $V_{DD}/2$, to connect to the non-inverting inputs 118 and 128 of the operational amplifiers 112 and 114. A capacitor 140 may be coupled to the power input 136 to stable the supply voltage $V_{DD}$ for the chip 100. A bypass capacitor 142 is coupled to the node 138 to be charged to the reference voltage $V_{DD}/2$, and the capacitance $C_B$ of the bypass capacitor 142 determines the charge rate of the reference signal Vref up to $V_{DD}/2$ and the discharge rate of the voltage on the node 138. The operational amplifier 112, the input resistor 110, and a feedback resistor 144 connected between the output 120 and the inverting input 116 of the operational amplifier 112 constitute a well-known amplifier, and in which the feedback resistor 144 and the input resistor 110 are both outside of the chip 100 for adjusting the gain of the amplifier. However, the feedback resistor 144 and the input resistor 110 may be integrated in the chip 100 instead. The other amplifier is constituted by the operational amplifier 114, an input resistor 122 and a feedback resistor 124, and has a unit gain, for inverting the output signal Vo+ to generate another output signal Vo–. The output signals Vo+ and Vo– constitute a pair of differential output signals for driving the loudspeaker 106. The chip 100 further comprises a bias control circuit 146 to generate two control signals 152 and 154, based on a sleep or shutdown signal SHUTDOWN originated from the system control unit and a select signal or bridge-tied-load signal SEL/BTL originated from the earphone socket, for the control of enabling and disabling the operational amplifiers 112 and 114.

During power-off, owing to the different discharge rates of the input coupling capacitor 102 and the bypass capacitor 142, an instant variation may occur in the signal at the output 120 of the chip 100, resulting in an unfavorable noise, referred to 'pops', emanated from the earphone 104 or loudspeaker 106. To remove this pops generation, a proposed solution is to provide two individual power supplies for the amplifier circuit of the chip 100. However, introducing a second power supply will have a higher system complexity and cost. In U.S. Pat. No. 5,939,938 to Kalb et al., switching the gain of or the input to the amplifier and controlling the discharge rate of the bypass capacitor are used during power-off to suppress the pops generation. The control signal for switching the gain of or the input to the amplifier and controlling the discharge rate of the bypass capacitor is further delayed in U.S. Pat. No. 6,346,854 to Heithoff, for a more precise control. However, these proposed arts eliminate only part of the factors causing power-off pops, and the improvement is not perfect enough. Even though the supply voltage drops down rapidly during power-off, the operational amplifier is still operated in a common mode before it is disabled, and thus the over-driving will result in instant variations of the output signal to generate pops. A detector circuit to detect the voltage difference between the input and output of a voltage regulator is proposed in U.S. Pat. No. 4,181,895 to Yoshida, by which a mute circuit is triggered to have the output of the amplifier silent when the voltage difference is lower than a predetermined threshold, and thus no pops are generated. On the other hand, after disabling the operational amplifier, due to the output signal dropping down slower than the supply voltage, it may force the body diode parasitic to the output stage transistor of the operational amplifier forward-biased, thereby providing another conductive pass between the drain and source of the output stage transistor to induce instant variations in the output signal and to generate pops accordingly. In U.S. Pat. No. 6,525,594 to Fugate et al., the body of the output stage transistor of the operational amplifier circuit is connected with a switch switching to a power input or a current path of the output stage transistor to prevent the body voltage from lower than the voltage on the current path. Alternatively, in U.S. Pat. No. 6,542,024 to Somayajula, a voltage is coupled to the body of the output stage transistor of the operational amplifier when the supply voltage drops down, to prevent the body voltage from lower than a predetermined threshold.

SUMMARY OF THE INVENTION

One object of the present invention is to provide an amplifier circuit and a method thereof for de-pops during the power-off of the amplifier circuit.

In an amplifier circuit according to the present invention, an amplifier is provided for receiving an input signal and a reference signal to generate an output signal therefrom when it is enabled, and the amplifier is disabled when the supply voltage to the amplifier drops down to a threshold or to a level higher than the reference signal a threshold.

In one embodiment, the control circuit comprises an inverter having its power input and signal input connected with the supply voltage and reference signal, respectively, and therefore the transition point of the inverter drops down when the supply voltage and reference signal drop down. Once the transition point crossing over the reference signal, the output of the inverter will have a state transition to disable the amplifier.

In another embodiment, the control circuit comprises a comparator for comparing the supply voltage with a predetermined threshold to generate a disable signal to disable the amplifier when the supply voltage drops down to a level equal to the threshold.

In yet another embodiment, the control circuit comprises an inverter having its power input and signal input connected with the supply voltage and a predetermined threshold, respectively, and therefore the transition point of the inverter drops down when the supply voltage drops down. Once the transition point crossing over the threshold, the output of the inverter will have a state transition to disable the amplifier.

Further, the output stage transistor of the amplifier is provided with a body voltage to prevent the body diode from being forward-biased. The body voltage is selected from the higher one of the supply voltage and the output signal, the supply voltage and a signal proportional to the reference signal, or the supply voltage and a signal proportional to the input signal, or another supply voltage higher than the output signal.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

In an amplifier circuit, the power-off pops are generated from the instant variations of the output signal, resulted from the inconsistent discharge rates between the input coupling capacitor and the bypass capacitor. For de-pop during power-off, according to the present invention, a disable signal is generated to disable the amplifier in the amplifier circuit when the supply voltage drops down to a predetermined threshold or to a level higher than the reference signal a predetermined threshold, thereby suppressing the instant variations in the output signal.

Figure 1:
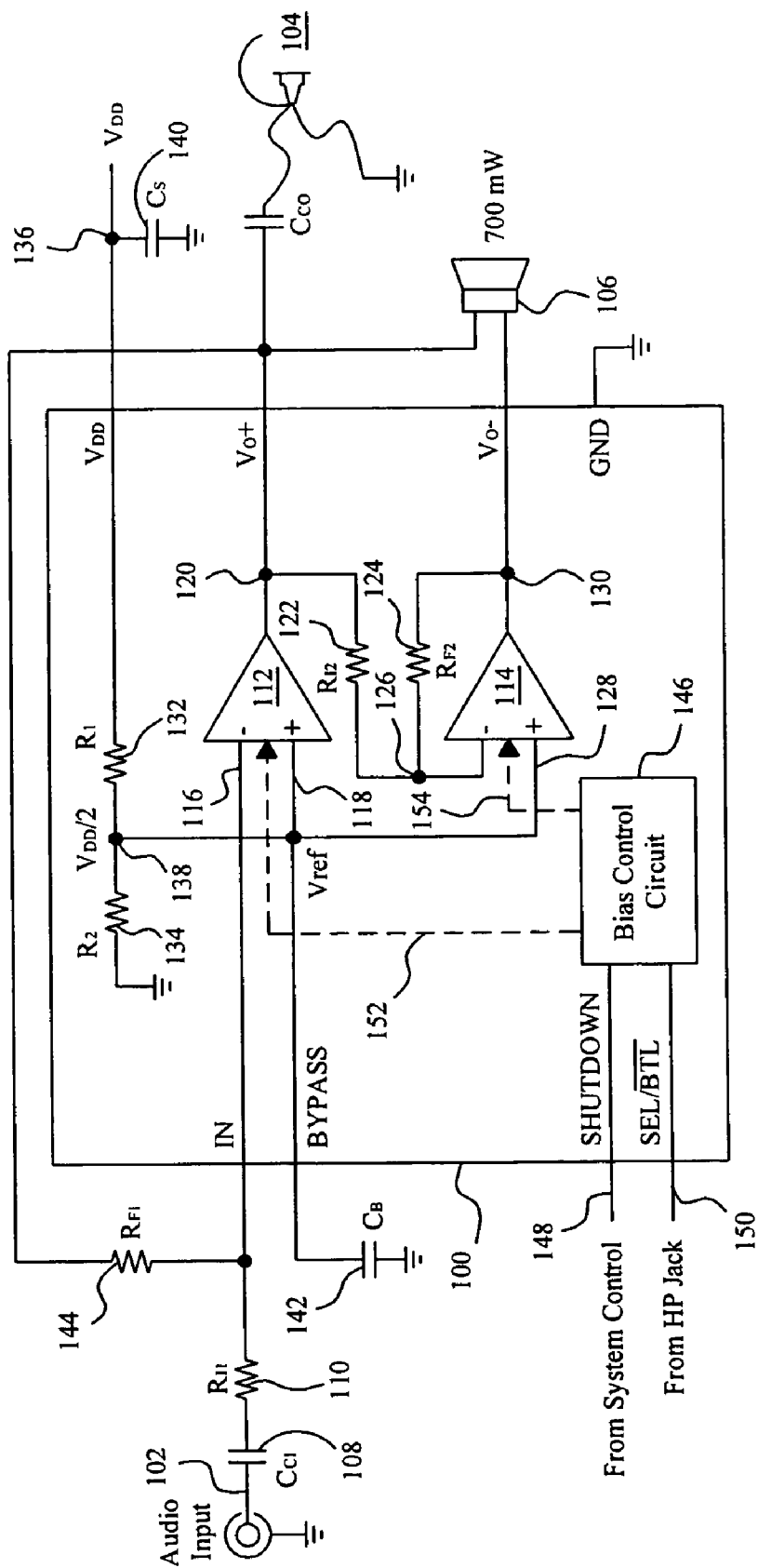
FIG. 1 shows an application circuit of a conventional audio amplifier chip.
Figure 2:
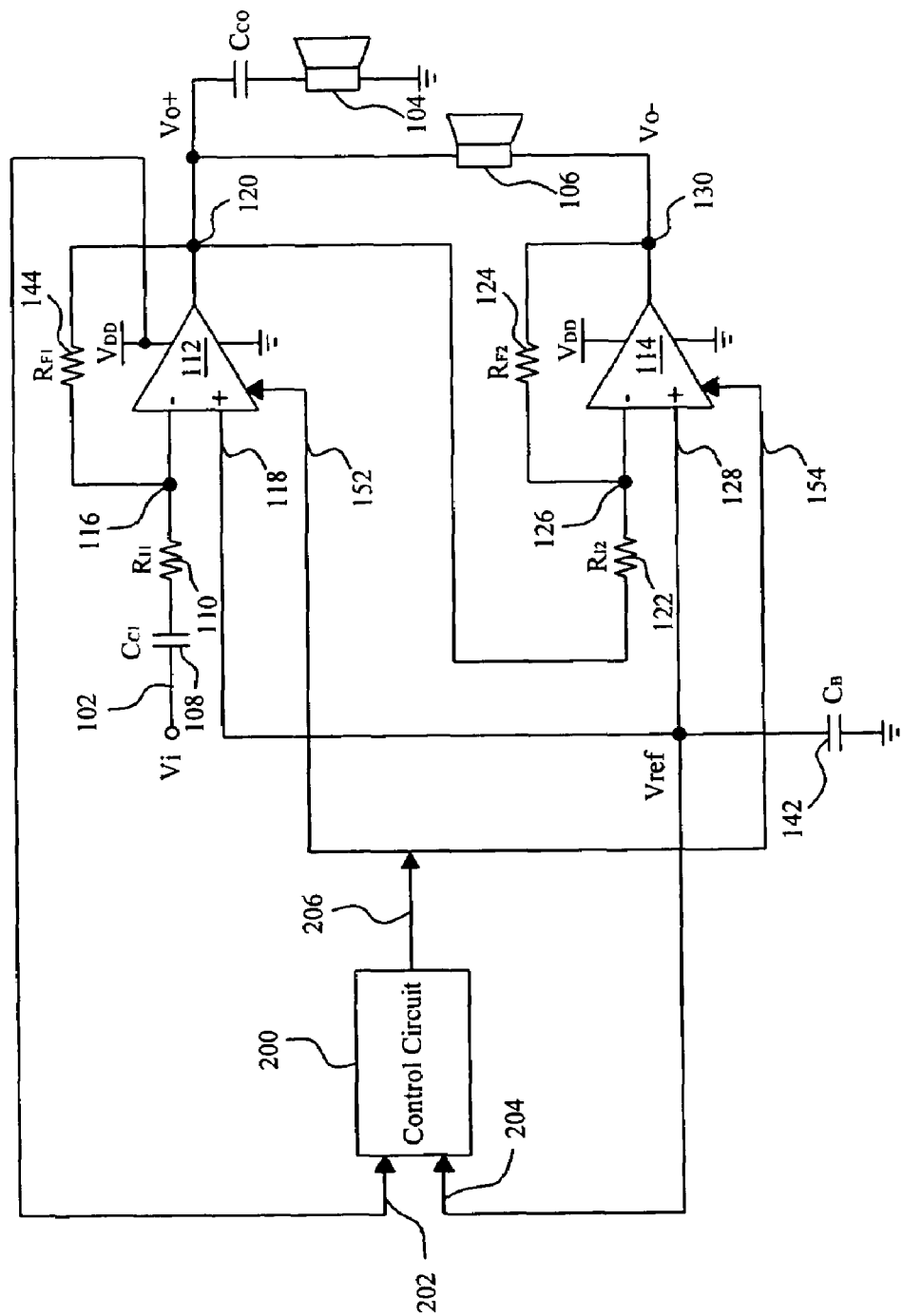
FIG. 2 shows a first embodiment of an amplifier circuit according to the present invention.

FIG. 2 shows an amplifier circuit according to the present invention, in which an amplifier comprises an operational amplifier 112, an input resistor 110 and a feedback resistor 144, the input resistor 110 is connected to the inverting input 116 of the operational amplifier 112, an input signal Vi is coupled to the input resistor 110 through an input coupling capacitor 108, the non-inverting input 118 of the operational amplifier 112 is connected with a reference signal Vref, the feedback resistor 144 is connected between the inverting input 116 and the output 120 of the operational amplifier 112, and when this amplifier is enabled, it has a gain to generate an output signal Vo+ at the output 120 from the input signal Vi and the reference signal Vref, so as to drive an earphone 104. On the other hand, the output signal Vo+ may be also inputted to another amplifier, and this second amplifier comprises an operational amplifier 114, an input resistor 122 and a feedback resistor 124, in which the input resistor 122 is connected between the inverting input 126 of the operational amplifier 114 and the output 120 of the operational amplifier 112, the feedback resistor 124 is connected between the inverting input 126 and the output 130 of the operational amplifier 114, the non-inverting input 128 of the operational amplifier 114 is also connected with the reference signal Vref. When the second amplifier is enabled, it has a unit gain, with which an output signal Vo− is generated at the output 130 of the operational amplifier 114 by inverting the output signal Vo+ from the first amplifier. Combining this signal Vo− with the signal Vo+, a pair of differential output signals are obtained for driving a loudspeaker 106. For the sake of avoiding the pops generation during power-off, a control circuit 200 has two inputs 202 and 204 connected with two feedback signals derived from the supply voltage $V_{DD}$ and the reference signal Vref, respectively. Then, a disable signal 206 may be generated based on these two feedback signals 202 and 204, so as to disable the operational amplifiers 112 and 114. During power-off, when the supply voltage $V_{DD}$ drops down to a predetermined threshold or to a level higher than the reference signal Vref a predetermined threshold, the control circuit 200 will disable the operational amplifiers 112 and 114 by the disable signal 206. Alternatively, the two feedback signals 202 and 204 in this embodiment may be modified so as to be proportional to the supply voltage $V_{DD}$ and the reference signal Vref, respectively. For instance, by amplifying or attenuating the supply voltage $V_{DD}$ and the reference signal Vref to generate the corresponding feedback signals 202 and 204, the purpose of generating the disable signal 206 from the relative levels with respect to the processed signals may be substantially accomplished.

Figure 3:
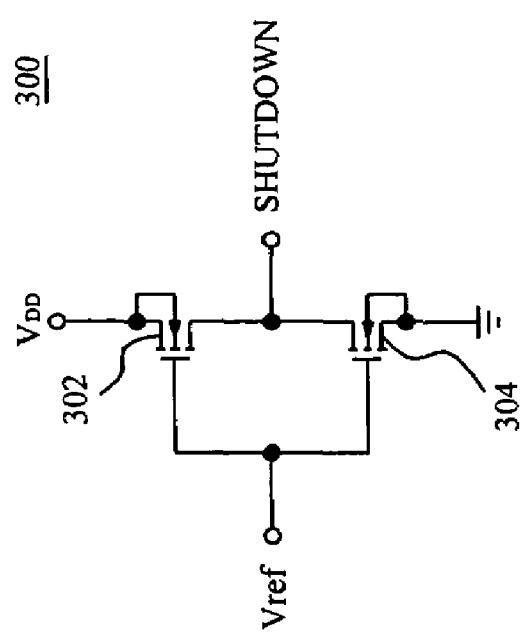
FIG. 3 shows one embodiment of the control circuit in the amplifier circuit of FIG. 2.

FIG. 3 shows one preferred embodiment for the control circuit 200 in FIG. 2, in which an inverter 300 includes two MOS transistors 302 and 304 connected in series between a power input and ground, with the gates and drains of the MOS transistors 302 and 304 connected to the signal input and signal output of the inverter 300, and the inputs 202 and 204 of the control circuit 200 shown in FIG. 2 are connected to the power input $V_{DD}$ and signal input Vref of the inverter 300. Both of the supply voltage $V_{DD}$ and reference signal Vref are not constant during power-off, and their relative level will determine the transition point of the inverter 300. During power-off, the supply voltage $V_{DD}$ drops down rapidly, while the reference signal Vref drops down more slowly, and the transition point of the inverter 300 drops down subsequently. When the transition point of the inverter 300 is crossing over the reference signal Vref, the output SHUTDOWN of the inverter 300 transits from the original state to another state, and this signal SHUTDOWN is the disable signal 206 of the control circuit 200 shown in FIG. 2, by which the amplifier 112 and 114 are disabled. As a result, the amplifier circuit of FIG. 2 is prevented from power-off pops generation.

Figure 4:
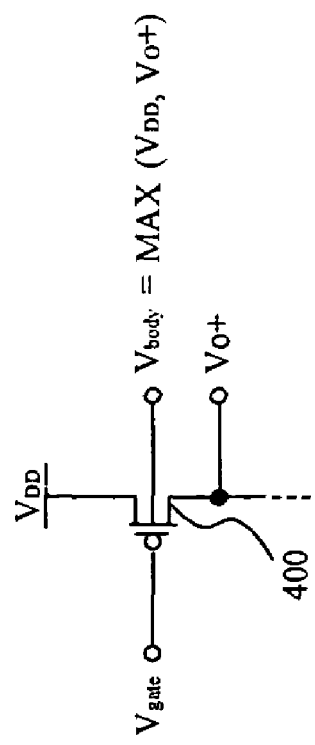
FIG. 4 shows an output stage transistor in an amplifier applied with a body voltage according to the present invention.

On the other hand, to prevent the supply voltage $V_{DD}$ drops down so rapidly to trigger the body diode of the output stage transistor of the amplifier forward-biased, as shown in FIG. 4, the output stage transistor 400 is provided with a body voltage $V_{body}$. Preferably, the body voltage $V_{body}$ is selected from the higher one of the supply voltage $V_{DD}$ and output signal Vo+, which may be accomplished with a comparator. During power-off, the supply voltage $V_{DD}$ drops down rapidly, while the output signal Vo+ drops down more slowly, and therefore, the body voltage $V_{body}$ is the supply voltage $V_{DD}$ when the supply voltage $V_{DD}$ is still higher than the output signal Vo+. Once the supply voltage $V_{DD}$ drops down to a level lower than the output signal Vo+, the body voltage $V_{body}$ is the output signal Vo+, and thereby the body diode is always maintained not forward-biased during power-off, such that no power-off pops will be generated therefrom. In another embodiment, alternatively, the reference signal Vref or the input signal Vi is multiplied by a coefficient to replace the output signal Vo+ to be compared to the supply voltage $V_{DD}$ to select the body voltage to be applied for the output stage transistor. In yet another embodiment, another supply voltage not lower than the output signal Vo+ is applied for the body voltage such that the body diode will never be forward-biased.

Figure 5:
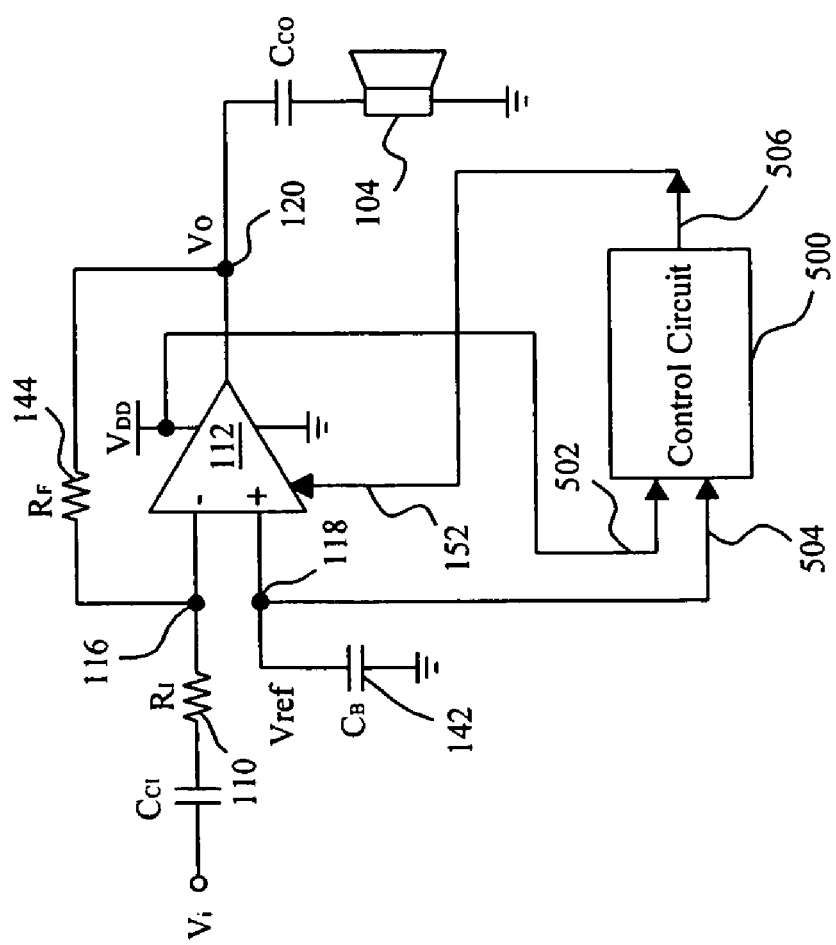
FIG. 5 shows a second embodiment of an amplifier circuit according to the present invention.

FIG. 5 shows another amplifier circuit according to the present invention, for driving a single-ended audio device, such as an earphone. In the amplifier circuit of FIG. 5, the operational principles of those elements designated with the same reference numerals as in FIG. 2 are also the same as those illustrated in the first embodiment. However, a control circuit 500 hereof receives the supply voltage $V_{DD}$ and the reference signal Vref from its inputs 502 and 504, respectively, and outputs a disable signal 506 accordingly for the operational amplifier 112 during power-off. The circuits shown in FIGS. 3 and 4 may also be applied for the control circuit 500. During power-off, when the supply voltage $V_{DD}$ drops down to a predetermined threshold or to a level higher than the reference signal Vref a predetermined threshold, the control circuit 500 will disable the operational amplifier 112 by the disable signal 506, so as to avoid the power-off pops generation.

Figure 6:
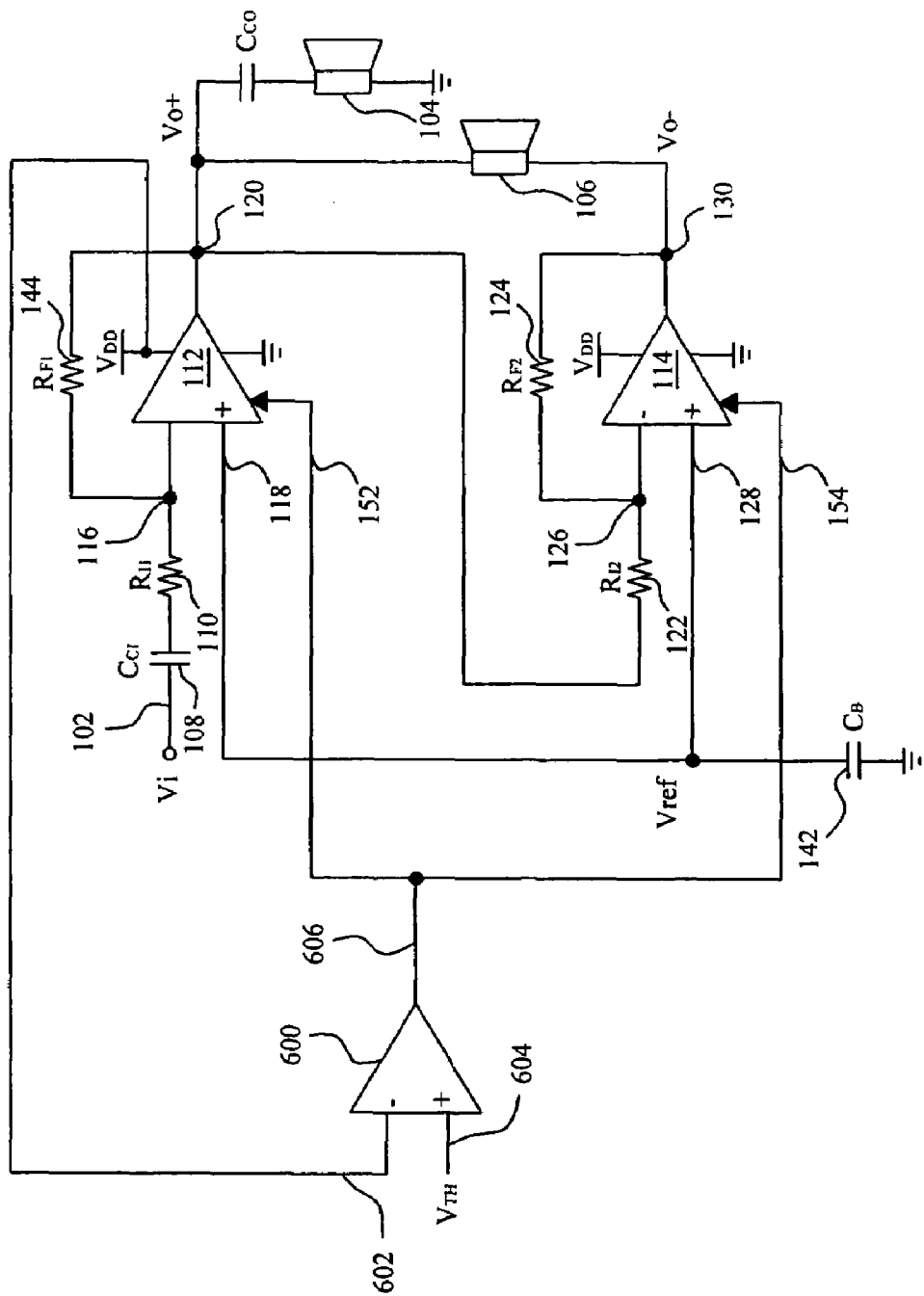
FIG. 6 shows a third embodiment of an amplifier circuit according to the present invention.

FIG. 6 shows a third embodiment of an amplifier circuit according to the present invention, and the operational principles of those elements hereof designated with the same reference numerals as in FIG. 2 are also the same as those illustrated in the first embodiment. The control circuit in this embodiment comprises a comparator 600 having its two inputs connected with the supply voltage $V_{DD}$ and a predetermined threshold $V_{TH}$, so as to generate a control signal on its output 606 for the operational amplifiers 112 and 114. During power-off, the supply voltage $V_{DD}$ drops down rapidly, and once the supply voltage $V_{DD}$ drops down to reach the level of the threshold $V_{TH}$, the control signal 606 will have a state transition such that the operational amplifiers 112 and 114 are disabled to avoid pops generation. The threshold $V_{TH}$ may be set to be a product of a nominal value of the supply voltage $V_{DD}$ at a normal operational state multiplied by a predetermined coefficient, for example 0.8× $V_{DD}$. Alternatively, the threshold $V_{TH}$ may be set to be a sum of the reference signal Vref and a predetermined difference, for example Vref+1.0V. This control circuit implemented with the comparator 600 may be also applied for the control circuit 500 shown in FIG. 5.

Figure 7:
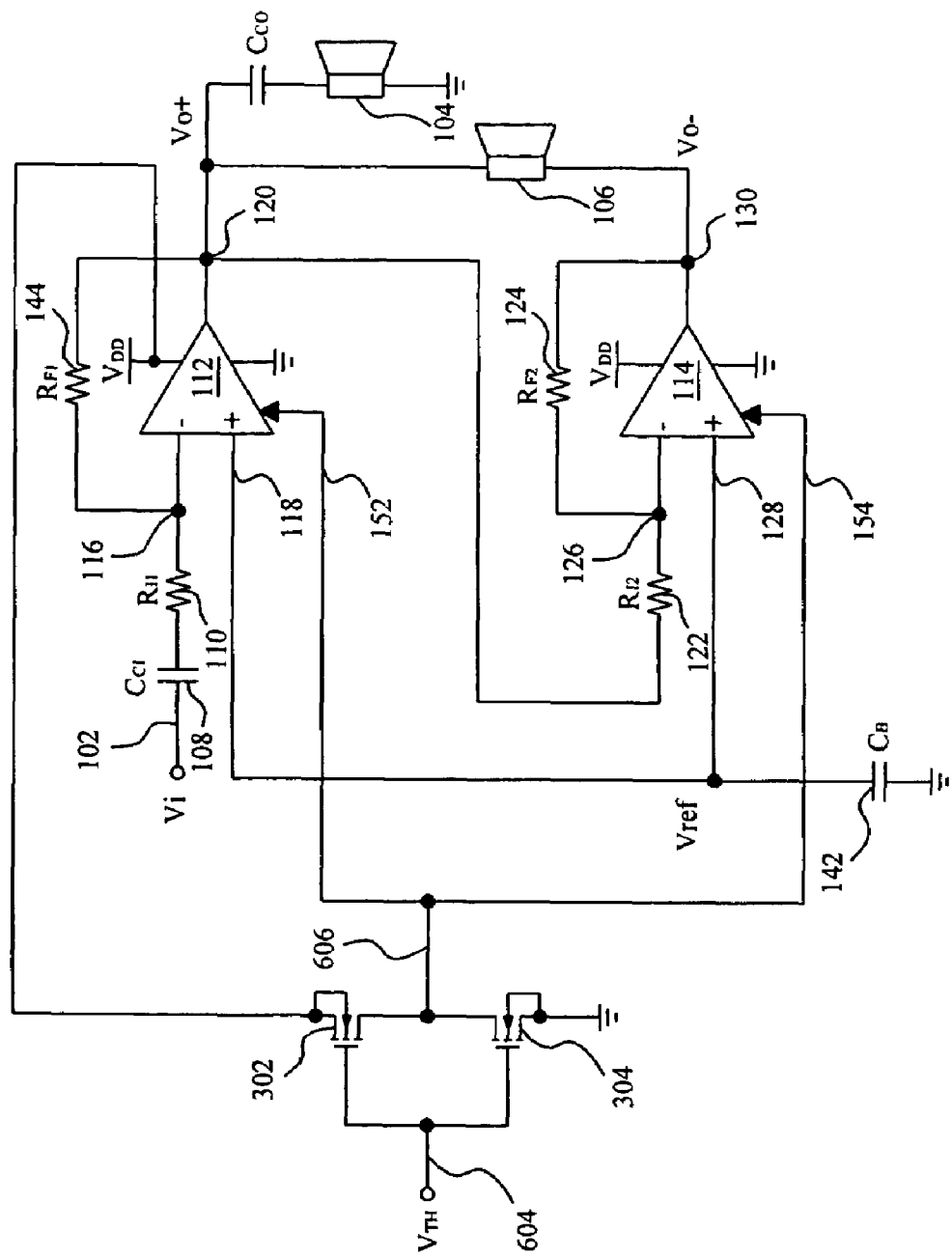
FIG. 7 shows a fourth embodiment of an amplifier circuit according to the present invention.

FIG. 7 shows a fourth embodiment of an amplifier circuit according to the present invention, and the operational principles of those elements hereof designated with the same reference numerals as in FIG. 2 are also the same as those illustrated in the first embodiment. The control circuit in this embodiment is also implemented with the inverter 300 shown in FIG. 3, only that the input 604 of the inverter 300 is provided with a predetermined threshold $V_{TH}$. When the supply voltage $V_{DD}$ drops down, the transition point of the inverter 300 drops down subsequently, and once the transition point of the inverter 300 crossing over the threshold $V_{TH}$, the output 606 of the inverter 300 will have a state transition such that the operational amplifiers 112 and 114 are disabled to avoid pops generation. As a result, the amplifier circuit is prevented from power-off pops. The threshold $V_{TH}$ may be set to be a product of a nominal value of the supply voltage $V_{DD}$ at a normal operational state multiplied by a predetermined coefficient, for example 0.8× $V_{DD}$. Alternatively, the threshold $V_{TH}$ may be set to be a sum of the reference signal Vref and a predetermined difference, for example Vref+1.0V. This control circuit implemented with the inverter 300 may be also applied for the control circuit 500 shown in FIG. 5.

In an amplifier circuit according to the present invention, the supply voltage is detected to directly generate a feedback signal for a control circuit to disable the operational amplifiers, the de-pop scheme is therefore applicable for any amplifier circuit having different supply voltages. In other words, this de-pop scheme is more flexible, and it will not need to modify or redesign the circuit for the applications for different supply voltages.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An amplifier circuit with reduced power-off transients, comprising:
   an amplifier connected to a supply voltage, the amplifier having respective inputs for receiving an input signal and a reference signal to generate an output signal therefrom when the amplifier is enabled;
   a first feedback signal generated from the supply voltage;
   a second feedback signal corresponds to the reference signal; and
   a control circuit having inputs respectively connected with the first and second feedback signals and an output coupled to a disable input of the amplifier for disabling the amplifier when the first feedback signal drops down to a threshold level that is a function of the second feedback signal.

2. The amplifier circuit of claim 1, wherein the control circuit comprises an inverter having a power input connected with the first feedback signal and a signal input connected with the second feedback signal.

3. The amplifier circuit of claim 1, wherein the amplifier comprises an output stage transistor having a body voltage selected from a higher one of the supply voltage and the output signal.

4. The amplifier circuit of claim 1, wherein the amplifier comprises an output stage transistor having a body voltage selected from a higher one of the supply voltage and a signal proportional to the reference signal.

5. The amplifier circuit of claim 1, wherein the amplifier comprises an output stage transistor having a body voltage selected from a higher one of the supply voltage and a signal proportional to the input signal.

6. The amplifier circuit of claim 1, wherein the amplifier comprises an output stage transistor having a body voltage higher than the output signal.

7. The amplifier circuit of claim 1, wherein the first feedback signal is proportional to the supply voltage, and the second feedback signal is proportional to the reference signal.

8. A de-pop method for operating an amplifier circuit, the method comprising the steps of:
   (a) providing an amplifier connected with a supply voltage and having respective inputs for receiving an input signal and a reference signal to generate an output signal therefrom when the amplifier is enabled;

(b) generating a first feedback signal corresponding to the supply voltage and a second feedback signal from the reference signal; and (c) disabling the amplifier when the first feedback signal drops down to a threshold level that is a function of the second feedback signal.

9. The method of claim 8, wherein the step (b) comprises the steps of:

connecting the first feedback signal to a power input of an inverter;

connecting the second feedback signal to a signal input of the inverter; and generating a disable signal from a signal output of the inverter for disabling the amplifier.

10. The method of claim 8, further comprising applying a body voltage selected from a higher one of the supply voltage and the output signal to an output stage transistor of the amplifier.

11. The method of claim 8, further comprising applying a body voltage selected from a higher one of the supply voltage and a signal proportional to the reference signal to an output stage transistor of the amplifier.

12. The method of claim 8, further comprising applying a body voltage selected from a higher one of the supply voltage and a signal proportional to the input signal to an output stage transistor of the amplifier.

13. The method of claim 8, further comprising applying a body voltage higher than the output signal to an output stage transistor of the amplifier.

14. The method of claim 8, wherein the first feedback signal is proportional to the supply voltage, and the second feedback signal is proportional to the reference signal.

15. An amplifier circuit with reduced power-off transients, comprising:

an amplifier connected to a supply voltage, the amplifier having respective inputs for receiving an input signal and a reference signal to generate an output signal therefrom when the amplifier is enabled; and a comparator for generating a disable signal by comparing the supply voltage with a threshold to disable the amplifier when the supply voltage drops down to the threshold, the threshold being equal to a product of a nominal value of the supply voltage at a normal operational state multiplied by a predetermined coefficient.

16. An amplifier circuit with reduced power-off transients, comprising:

an amplifier connected to a supply voltage, the amplifier having respective inputs for receiving an input signal and a reference signal to generate an output signal therefrom when the amplifier is enabled; and a comparator for generating a disable signal by comparing the supply voltage with a threshold to disable the amplifier when the supply voltage drops down to the threshold, the threshold being equal to a sum of the reference signal and a predetermined difference.

17. The amplifier circuit of claim 15, wherein the amplifier comprises an output stage transistor having a body voltage selected from a higher one of the supply voltage and the output signal.

18. The amplifier circuit of claim 16, wherein the amplifier comprises an output stage transistor having a body voltage selected from a higher one of the supply voltage and a signal proportional to the reference signal.

19. The amplifier circuit of claim 15, wherein the amplifier comprises an output stage transistor having a body voltage selected from a higher one of the supply voltage and a signal proportional to the input signal.

20. The amplifier circuit of claim 15, wherein the amplifier comprises an output stage transistor having a body voltage higher than the output signal.

21. A de-pop method for operating an amplifier circuit including an amplifier connected to a supply voltage and having respective inputs for receiving an input signal and a reference signal to generate an output signal therefrom when the amplifier is enabled, the method comprising the steps of:

(a) comparing the supply voltage with a threshold, the threshold being equal to a sum of the reference signal and a predetermined difference; and (b) disabling the amplifier when the supply voltage drops down to the threshold.

22. A de-pop method for operating an amplifier circuit including an amplifier connected to a supply voltage and having respective inputs for receiving an input signal and a reference signal to generate an output signal therefrom when the amplifier is enabled, the method comprising the steps of:

(a) comparing the supply voltage with a threshold, the threshold being equal to a product of a nominal value of the supply voltage at a normal operational state multiplied by a predetermined coefficient; and (b) disabling the amplifier when the supply voltage drops down to the threshold.

23. The method of claim 22, further comprising applying a body voltage selected from a higher one of the supply voltage and the output signal to an output stage transistor of the amplifier.

24. The method of claim 21, further comprising applying a body voltage selected from a higher one of the supply voltage and a signal proportional to the reference signal to an output stage transistor of the amplifier.

25. The method of claim 21, further comprising applying a body voltage selected from a higher one of the supply voltage and a signal proportional to the input signal to an output stage transistor of the amplifier.

26. The method of claim 21, further comprising applying a body voltage higher than the output signal to an output stage transistor of the amplifier.

27. An amplifier circuit with reduced power-off transients, comprising:

an amplifier connected to a supply voltage, the amplifier having respective inputs for receiving an input signal and a reference signal to generate an output signal therefrom when the amplifier is enabled; and an inverter having a power input connected with the supply voltage and a signal input connected with a threshold, for generating a disable signal to disable the amplifier when the supply voltage drops down to the threshold, the threshold being equal to a sum of the reference signal and a predetermined difference.

28. An amplifier circuit with reduced power-off transients, comprising:

an amplifier connected to a supply voltage, the amplifier having respective inputs for receiving an input signal and a reference signal to generate an output signal therefrom when the amplifier is enabled; and an inverter having a power input connected with the supply voltage and a signal input connected with a threshold, for generating a disable signal to disable the amplifier when the supply voltage drops down to the threshold, the threshold being equal to a product of a nominal value of the supply voltage at a normal operational state multiplied by a predetermined coefficient.

29. The amplifier circuit of claim 28, wherein the amplifier comprises an output stage transistor having a body voltage selected from a higher one of the supply voltage and the output signal.

30. The amplifier circuit of claim 27, wherein the amplifier comprises an output stage transistor having a body voltage selected from a higher one of the supply voltage and a signal proportional to the reference signal.

31. The amplifier circuit of claim 27, wherein the amplifier comprises an output stage transistor having a body voltage selected from a higher one of the supply voltage and a signal proportional to the input signal.

32. The amplifier circuit of claim 27, wherein the amplifier comprises an output stage transistor having a body voltage higher than the output signal.

33. A de-pop method for operating an amplifier circuit including an amplifier connected with a supply voltage to receive an input signal and a reference signal to generate an output signal therefrom when it is enabled, the method comprising the steps of:
   (a) connecting the supply voltage to a power input of an inverter;
   (b) connecting a threshold to a signal input of the inverter, the threshold being equal to a sum of the reference signal and a predetermined difference; and
   (c) disabling the amplifier when the supply voltage drops down to the threshold.

34. A de-pop method for operating an amplifier circuit including an amplifier connected with a supply voltage to receive an input signal and a reference signal to generate an output signal therefrom when it is enabled, the method comprising the steps of:
   (a) connecting the supply voltage to a power input of an inverter;
   (b) connecting a threshold to a signal input of the inverter, the threshold being equal to a product of a nominal value of the supply voltage at a normal operational state multiplied by a predetermined coefficient; and
   (c) disabling the amplifier when the supply voltage drops down to the threshold.

35. The method of claim 34, further comprising applying a body voltage selected from a higher one of the supply voltage and the output signal to an output stage transistor of the amplifier.

36. The method of claim 33, further comprising applying a body voltage selected from a higher one of the supply voltage and a signal proportional to the reference signal to an output stage transistor of the amplifier.

37. The method of claim 33, further comprising applying a body voltage selected from a higher one of the supply voltage and a signal proportional to the input signal to an output stage transistor of the amplifier.

38. The method of claim 33, further comprising applying a body voltage higher than the output signal to an output stage transistor of the amplifier.

* * * * *